United States Patent
Raffin et al.

(10) Patent No.: US 6,770,144 B2
(45) Date of Patent: Aug. 3, 2004

(54) MULTIDEPOSITION SACVD REACTOR

(75) Inventors: Patrick Raffin, Joinville Le Pont (FR); Fabrice Delarue, Paris (FR); Jean Marc Waechter, Saint Vincent de Mercuze (FR); Christophe Balsan, Vaux Le Peail (FR); Joel Journe, Ceailly en Biere (FR)

(73) Assignee: International Business Machines Corporation, Armonk, NY (US)

( * ) Notice: Subject to any disclaimer, the term of this patent is extended or adjusted under 35 U.S.C. 154(b) by 261 days.

(21) Appl. No.: 09/904,424

(22) Filed: Jul. 12, 2001

(65) Prior Publication Data

US 2002/0173164 A1 Nov. 21, 2002

(30) Foreign Application Priority Data

Jul. 25, 2000 (EP) .............................. 00480069

(51) Int. Cl.[7] .......................... C23C 16/00; C23F 1/00; H01L 21/306
(52) U.S. Cl. ................. 118/719; 118/728; 156/345.33; 156/345.34; 156/345.29
(58) Field of Search ............................... 118/719, 728, 118/712; 156/345, 333, 345.34, 345.29

(56) References Cited

U.S. PATENT DOCUMENTS

| | | | | |
|---|---|---|---|---|
| 3,919,968 A | * | 11/1975 | Sandmann et al. | 118/663 |
| 4,795,880 A | * | 1/1989 | Hayes et al. | 219/121.52 |
| 5,188,501 A | * | 2/1993 | Tomita et al. | 414/416.08 |
| 6,071,353 A | * | 6/2000 | Gallagher | 134/2 |
| 6,120,660 A | * | 9/2000 | Chu et al. | 204/298.15 |
| 6,623,563 B2 | * | 9/2003 | Hosokawa | 118/728 |
| 2002/0039835 A1 | * | 4/2002 | Balsan et al. | 438/597 |

FOREIGN PATENT DOCUMENTS

| | | | | | |
|---|---|---|---|---|---|
| JP | 53066164 A | * | 6/1978 | ......... | H01L/21/205 |
| JP | 54152465 A | * | 11/1979 | ......... | H01L/21/206 |
| JP | 01125819 A | * | 5/1989 | ......... | H01L/21/205 |
| JP | 06196489 A | * | 7/1994 | ......... | H01L/21/322 |
| JP | 10041251 A | * | 2/1998 | ......... | H01L/21/285 |
| JP | 2001102358 A | * | 4/2001 | ....... | H01L/21/3065 |

* cited by examiner

*Primary Examiner*—Parviz Hassanzadeh
*Assistant Examiner*—Karla Moore
(74) *Attorney, Agent, or Firm*—Margaret A. Pepper

(57) ABSTRACT

There is disclosed a high throughput multideposition SACVD reactor that enables the rapid thermal deposition of dielectric materials such as $Si_3N_4$, $SiO_2$, and $SiON$ and non-dielectric materials such as polysilicon onto a semiconductor substrate in the same chamber according to the desired sequence. Such a reactor has a processing chamber which is well adapted to single semiconductor wafer processing. The processing chamber includes an improved susceptor to support the wafer and a specific gas distribution system adapted to supply the different gases used in the deposition process and for cleaning. The improved susceptor consists of a standard carbon plate coated with a polysilicon film to protect it against said cleaning gases when they are aggressive to carbon. The present invention also encompasses a method of fabricating said improved susceptor.

11 Claims, 5 Drawing Sheets

MULTIDEPOSITION SACVD REACTOR

FIELD OF THE INVENTION

The present invention relates to the manufacture of semiconductor integrated circuits (ICs) and more particularly to a multideposition sub-atmospheric chemical vapor deposition (SACVD) reactor enabling the rapid thermal deposition of dielectric materials such $Si_3N_4$, $SiO_2$, and SiON and of non-dielectric materials such as polysilicon onto a substrate. According to the present invention, said dielectric/non-dielectric materials can be now deposited according to the desired sequence in the same chamber of the multideposition SACVD reactor, significantly reducing cycle time, total thermal budget and pattern factor effects.

BACKGROUND OF THE INVENTION

Short cycle time and low thermal budget are certainly the most critical points for Application Specific Integrated Circuit (ASIC) and Dynamic Random Access Memory (DRAM) products manufacturing respectively. The continuous technical progress in the last decades has resulted in the emergence of new techniques to improve product integration and speed that shows out the necessity to work deeper on deposition tool to improve their characteristics. Requirements such as low thermal budget, low pattern factor, foreign element control and short cycle time are now becoming of paramount importance. A low thermal budget is essential to keep IGFET effective channel length ($L_{eff}$) within specifications, to increase the process window and to have low junction contact resistance. Another important parameter is the pattern factor which is determining to embed memory cells in a logic chip. Still another parameter (previously deemed more secondary) is the foreign element control. Foreign elements that are incorporated into the deposited films during fabrication also drive device performance, and thus are becoming more important to date, as devices become more and more dense and complex. The possibility to control foreign element presence in deposited films facilitates the tuning of the devices and the correction or adjustment of some electrical fails such as junction leakages and the retention time. Finally, short cycle times which increase the manufacturing throughput are also worthwhile in terms of cost reduction. All these parameters have become critical in semiconductor devices particularly when it is required to deposit dielectric and non-dielectric materials in sequence according to the Chemical Vapor Deposition (CVD) technique. It would be highly desirable to perform the maximum deposition steps in the same equipment without unloading the wafers in order to improve the manufacturing throughput and to reduce the cycle time.

In the course of fabricating IGFETs for a standard DRAM product, at the stage of the gate conductor formation, it is required to form a stack (GC stack) comprised of a bottom 10 nm thick $SiO_2$ gate layer, then a 80 nm thick doped polysilicon layer, a 70 nm thick tungsten silicide ($WSi_x$) layer and finally a 180 nm thick top protective cap $Si_3N_4$ layer. Next, the GC stack is patterned by dry etching to produce the gate conductor lines (GC lines) and a thin $SiO_2$ spacer is formed by thermal oxidation on the exposed sidewalls of the doped polysilicon material. All these processing steps are performed in a different tool in the so-called Middle End Of the Line (MEOL) module.

For instance, the thin $SiO_2$ bottom gate layer is obtained by thermal oxidation using an Atmospheric Pressure Oxidation furnace (APOX) as standard, such as the SVG VTR 7000 (oxidation) vertical furnace sold by SVG-THERMCO, San Jose, Calif., USA. The deposition of the 80 nm thick doped polysilicon layer and the 70 nm thick $WSi_x$ layer is performed in two different chambers of a SACVD Centura HTF reactor, a tool manufactured by Applied Materials Inc, Santa Clara, Calif., USA using the following operating conditions:

Doped Polysilicon Deposition

| | |
|---|---|
| Pressure: | 80 Torr |
| Temperature: | 660° C. |
| $SiH_4$ flow: | 0.3 slm |
| $PH_3$ flow: | 0.09 slm |
| $H_2$ flow: | 9.9 slm |
| Dep. rate: | 80 nm/min | wherein "sccm" denotes standard cubic centimers per minute and "slm" denotes standard liters per minute.

$WSi_x$ Deposition

| | |
|---|---|
| Pressure: | 1 Torr |
| Temperature: | 550° C. |
| $WF_6$ flow: | 2.4 sccm |
| $SiH_2Cl_2$ flow: | 175 sccm |
| Ar flow: | 1500 sccm |
| Dep. rate: | 12 nm/min |

Finally, the $Si_3N_4$ material is deposited in a LPCVD batch furnace, such as a TEL Alpha 8s, a tool sold by TOKYO ELECTRON Ltd, Tokyo, Japan using the operating conditions recited below.

$Si_3N_4$ Deposition

Step 1

| | |
|---|---|
| Pressure: | 150 mTorr |
| Temperature: | 715° C. |
| $NH_3$ flow: | 250 sccm |
| DCS flow: | 50 sccm |
| Wafer spacing: | 0.2 inch |
| Dep. rate: | 0.7 nm/min |
| Dep. time: | 40 min |

Step 2

| | |
|---|---|
| Pressure: | 80 mTorr |
| Temperature: | 770° C. |
| $NH_3$ flow: | 400 sccm |
| DCS flow: | 80 sccm |
| Wafer spacing: | 0.2 inch |
| Dep. rate: | 1.5 nm/min |
| Dep. time: | 120 min |

The first step must be conducted at a low temperature to prevent $WSi_x$ oxidation at boat insertion in the furnace. About 100 wafers are processed for a total time (including loading/unloading operations) of about 375 min.

TABLE I below summarizes this sequence of deposition steps that are performed in the MEOL module.

TABLE I

| Materials | Deposition process |
| --- | --- |
| $SiO_2$ | APOX |
| Doped polysilicon | SACVD (chamber 1) |
| $WSi_x$ | SACVD (chamber 2) |
| $Si_3N_4$ | LPCVD |

More generally, if we consider all processing steps that are performed in the DRAM manufacturing line, the use of LPCVD and APOX furnaces are substantially limited to the Front End Of the Line (FEOL) and MEOL modules, as summarized in TABLE II below, for the deposition for different types of materials.

TABLE II

| Modules | FEOL | MEOL |
| --- | --- | --- |
| Temp. | 600–950° C. | 550–750° C. |
| Time | 3–7 H | 3–7 H(1); 5 min(2) |
| $Si_3N_4$ | LPCVD | LPCVD (1) |
| SiON | LPCVD | LPCVD (1) |
| $SiO_2$ | APOX | APOX (1) |
| Polysil | LPCVD | SACVD (2) |
| $WSi_x$ | | SACVD (2) |

(1) and (2) respectively refer to the duration for LPCVD/APOX and SACVD processes. There is no breakdown when the wafer is moved from chamber 1 to chamber 2 of the SACVD tool but there is a significant breakdown after the wafer is unloaded from chamber 2 to be loaded in the LPCVD furnace. Because, the LPCVD tool is of the batch type, there is an important wait time before a full batch of 100 wafers is loaded. As a consequence, before inserting the boat in the furnace, the wafers need to be cleaned for instance in a FSI spray tool (FLUOROWARE SYSTEMS Inc., Minneapolis, USA) using a SP/Huang AB cleaning sequence. As a whole, these operations are time consuming.

It is not possible to deposit the $Si_3N_4$ material in the same AME Centura reactor because processing chambers are strictly limited to the deposition of polysilicon films or $WSi_x$ films.

Applicants have discovered a manner to modify this conventional SACVD reactor normally exclusively used to perform polysilicon deposition to add the capacity of depositing dielectric materials such as $Si_3N_4$, SiON and $SiO_2$ in addition to polysilicon. As a result, multideposition of materials as different as dielectric and polysilicon in the reactor chamber according to any desired sequence is now possible without the above mentioned inconveniences (wait time, cleaning and long cycle time).

SUMMARY OF THE INVENTION

It is therefore a primary object of the present invention to provide a multideposition CVD reactor enabling the rapid thermal deposition of dielectric materials such as $Si_3N_4$, $SiO_2$, and SiON and non-dielectric materials such as polysilicon onto a substrate in the same chamber of the reactor.

It is another primary object of the present invention to provide a multideposition CVD reactor provided with multiple chambers enabling the rapid thermal deposition of dielectric materials such as $Si_3N_4$, $SiO_2$, and SiON and non-dielectric materials such as polysilicon onto a substrate in two dedicated chambers of the reactor.

It is another object of the present invention to provide a multideposition CVD reactor enabling the rapid thermal deposition of dielectric materials such as $Si_3N_4$, $SiO_2$, and SiON and non-dielectric materials such as polysilicon onto a substrate that is particularly adapted to ASIC production (short cycle times and low thermal budget).

It is another object of the present invention to provide a multideposition CVD reactor enabling the rapid thermal deposition of dielectric materials such as $Si_3N_4$, $SiO_2$, and SiON and non-dielectric materials such as polysilicon onto a substrate that is provided with an improved susceptor and a gas distribution system adapted to multiple material deposition.

It is another object of the present invention to provide a multideposition CVD reactor enabling the rapid thermal deposition of dielectric materials such as $Si_3N_4$, $SiO_2$, and SiON and non-dielectric materials such as polysilicon onto a substrate that allows high throughput.

It is another object of the present invention to provide a multideposition CVD reactor enabling the rapid thermal deposition of dielectric materials such as $Si_3N_4$, $SiO_2$, and SiON and non-dielectric materials such as polysilicon onto a substrate that can be widely used elsewhere in the manufacturing line irrespective the module (FEOL/MEOL).

It is still another object of the present invention to provide a multideposition CVD reactor enabling the rapid thermal deposition of dielectric materials such as $Si_3N_4$, $SiO_2$, and SiON and non-dielectric materials such as polysilicon onto a substrate that is well adapted to the fabrication of borderless polysilicon contacts in advanced EDRAM/SDRAM silicon chips.

It is still another further object of the present invention to provide a multideposition CVD reactor enabling the rapid thermal deposition of dielectric materials such as $Si_3N_4$, $SiO_2$, and SiON and non-dielectric materials such as polysilicon onto a substrate that is well adapted to fully integrate the GC stack fabrication process in advanced SDRAM silicon chips.

According to the present invention there is described a multideposition sub-atmospheric chemical vapor deposition (SACVD) reactor comprising: a substrate processing chamber; a carbon susceptor adapted to hold a substrate in said substrate processing chamber during a SACVD operation, wherein said carbon susceptor is coated by a polysilicon film to protect it against said cleaning gases; a gas distribution system adapted to introduce gases into said substrate processing chamber and including appropriate valves, gas supply lines and other equipment necessary to flow gases into the substrate processing chamber; wherein said gases include dielectric/non-dielectric forming gases and in-situ cleaning gases that are aggressive to carbon; a heating system to heat the susceptor/wafer to the adequate deposition temperature; a pressurization system adapted to set a pressure level within said substrate processing chamber; and a controller coupled to said gas distribution system and pressurization system for directing the operation of the SACVD reactor.

When the SACVD Centura reactor is used as the base deposition tool, the present invention also concerns the method of coating said carbon plate in the case, the dielectric material to be deposited is $Si_3N_4$ to render it $NF_3$ resistant, said method comprising the steps of: a) placing the standard carbon susceptor in the reactor processing chamber; b) cleaning the chamber interior volume with HCl; c) purging said interior volume with $H_2$; d) coating the susceptor bottom with a film of polysilicon using a DCS precursor; e) purging said interior volume with $H_2$; f) coating the susceptor top with a film of polysilicon using a $SiH_4$ precursor; and g) purging said interior volume with $H_2$.

A multideposition process is now made possible with tools that are provided with multiple chambers, such as the AME Centura HTF reactor, wherein every chamber can be dedicated to the deposition of a single material (dielectric or polysilicon) for a totally integrated process (cluster mode).

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings.

DESCRIPTION OF THE PREFERRED EMBODIMENT

Figure 1:
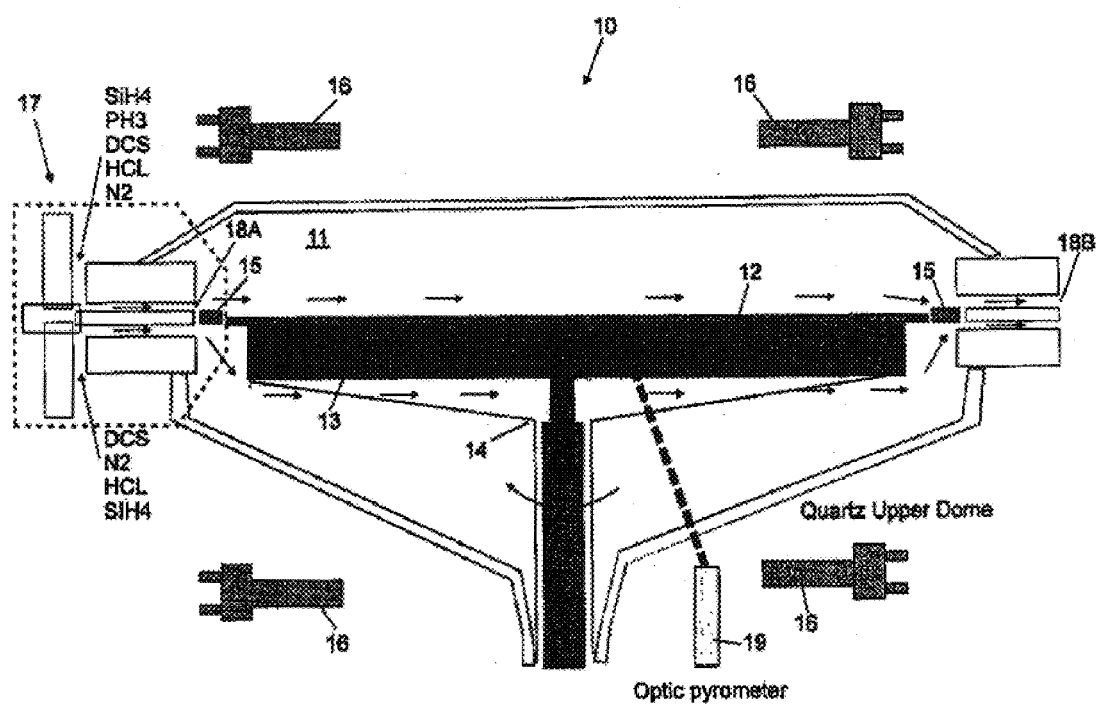
FIG. 1 schematically shows the cross sectional view of a conventional SACVD reactor, in the instant case, the AME HTF Centura reactor.

Historically, LPCVD processes have been performed in vertical furnaces. In the past several years, new deposition tools have become available which overcome the limitations of vertical furnaces because they are single-wafer processing based systems. The SACVD Centura HTF reactor is a good example of that new generation of deposition equipments. However, it is strictly limited to the deposition of polysilicon films. It is a cold-wall reactor that uses radiant heating for thermal energy. It operates at reduced pressure and in a temperature range of 550–1200° C. (depending upon the type of operation: deposition or cleaning). FIG. 1 schematically shows the cross-section of the SACVD Centura reactor with its major elements. Now turning to FIG. 1, reactor 10 has top and bottom walls (dome), side walls and a bottom wall that define the internal volume of the processing vacuum chamber 11 into which a substrate, typically a silicon wafer 12, can be loaded. The wafer 12 sits on a carbon susceptor 13 which is supported by a quartz pedestal 14 that can be rotated. A preheat ring 15 surrounds the susceptor 13. The wafer 12 and susceptor 13 are heated by banks of lamps 16 located outside above and below the process chamber 11. The top and bottom walls of the chamber are made of quartz and thus are transparent to light from external lamps in order to heat the susceptor, the wafer and the preheat ring. Gas distribution system 17 is provided with a gas input port or inlet 18A connected to a gas manifold to supply one or a mixture of gases in the process chamber 11 via a plurality of pipes. The gas concentrations and flow rate through each of these pipes are selected as standard to produce reactant gas flows and concentration profiles that optimize the deposition process. Reactor 10 further includes pressurization means connected to the gas output port or outlet 18B to produce the desired vacuum into process chamber 11 and temperature measurement means, typically a pyrometer 19, as known for those skilled in the art.

Due to the particular construction of the AME Centura reactor, there is no substantial communication between the upper and lower volumes of the processing chamber 11. Consequently, as apparent in FIG. 1 (see arrows near inlet 18), certain gases such as $SiH_4$, $PH_3$, DCS, HCl and $N_2$ are injected in the upper volume (above wafer 12) while other gases such as DCS, $N_2$ and HCl are injected in the lower volume (under susceptor 13). In normal operation, the gases flow from the gas inlet 18A across the preheat ring 15 (where the gases are warmed-up) then across the surface of the wafer 12 in the direction of the outlet 18B to perform the polysilicon film deposition. The process gases flow horizontally over the wafer in a laminar flow pattern from the gas inlet across the preheat ring and the wafer to the outlet where they exhaust.

Some important modifications have been made to adapt the reactor 10 of FIG. 1 to allow the multideposition feature according to the present invention.

Figure 2:
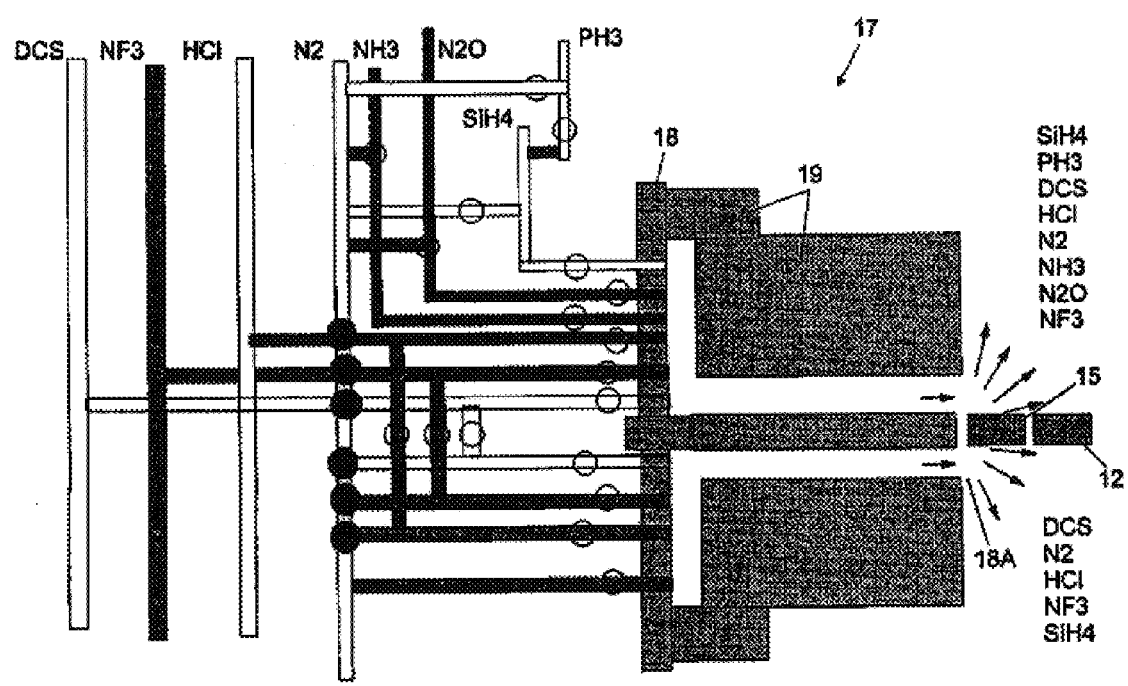
FIG. 2 is a diagram of the gas distribution system illustrating the different gas sources and mixes of the AME Centura reactor once modified according to the present invention.

The original gas distribution system 17 has been modified according to the present invention. Now turning to FIG. 2, new gas lines and valves have been added (shown in grey) to transport $NF_3$, $NH_3$ and $N_2O$ now required according to the present invention as it will be described in due course.

In the equipment sold by APPLIED MATERIALS, there is a baratron gauge mounted at the reactor outlet 18B that is used to perform the pressure measurements. Now, still according to the present invention, it is heated to about 150° C. to prevent any $Si_3N_4$ deposition on its membrane that would be damaged accordingly.

Before the AME Centura reactor is used for the first dielectric material deposition, typically $Si_3N_4$, the original carbon susceptor is submitted in-situ to the sequence of steps that will be now described by reference to flow-chart 20 illustrated in FIG. 3. The polysilicon coating procedure described below is relatively complex because of the particular construction of the AME Centura reactor and its resident software. A specific conditioning of the susceptor is required because it is made of carbon. $NF_3$ which is the preferred cleaning chemical compound to remove the $Si_3N_4$ material deposited on the reactor walls and the susceptor is known to be very aggressive to carbon (other fluorinated compounds, e.g. $ClF_3$, are adequate as well). The carbon susceptor protection against $NF_3$ chemical is first ensured by a coating of polysilicon (about 4 $\mu$m thick) performed on the susceptor bottom with a $SiH_2Cl_2$ (DCS) chemistry. In fact, this polysilicon coating plays a double role: it not only protects the susceptor bottom, it also allows determination of the susceptor temperature by a measure of its emissivity. Then, another polysilicon coating (about 1.5 $\mu$m thick) is performed on the susceptor top with a $SiH_4$ chemistry.

Figure 3:
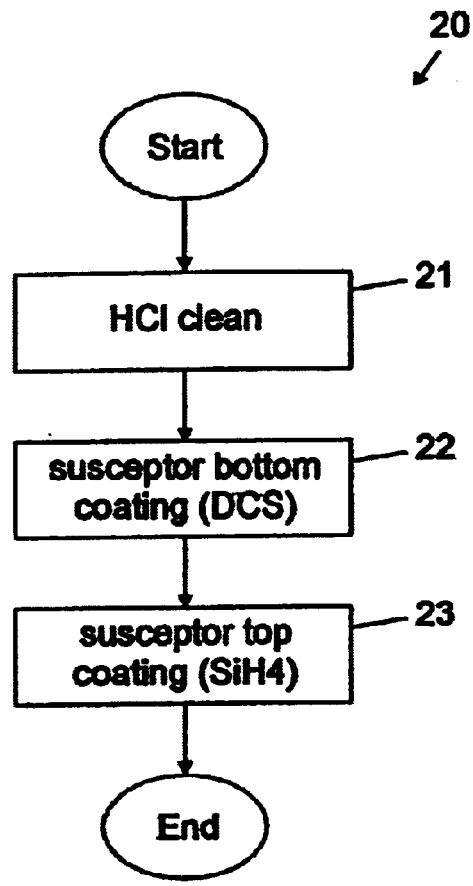
FIG. 3 is a flow chart illustrating the main steps of fabricating the improved susceptor according to the present invention that is resistant to $NF_3$ in-situ clean.

Now turning to FIG. 3, the carbon susceptor is first cleaned (box 21) using the following operating conditions:

HCl Clean

| | |
|---|---|
| Lamp power: | 43 kW (#1200° C.) |
| Pressure: | 660 Torr |
| HCl flow: | 9.9 slm |
| $H_2$ flow: | 5 slm |

After HCl cleaning, the chamber is cooled down to 950° C. and the pressure is reduced down to 80 Torr.

After pressure and temperature stabilization, DCS is flowed in the lower volume of the chamber and the susceptor bottom is now coated with polysilicon (box 22). Operating conditions are recited below:

Polysilicon coating (susceptor bottom)

| | |
|---|---|
| Lamp power: | 26 kW (#950° C.) |
| Duration: | 540 s |
| DCS flow: | 0.4 slm |
| $H_2$ flow: | 19 slm |
| Dep. rate: | 300 nm/min |

The temperature is not monitored during the bottom coating but is rather set by the lamp power. This is because the pyrometer 19 reading fluctuates during the coating operation. To ensure a good emissivity of the bottom polysilicon coating, it is important to get the right thickness of the polysilicon film. A thickness of about 4 $\mu$m is adequate for protection and accurate temperature measurement. In this case, with a deposition between 300 nm/mn and 350 nm/mn, only a few minutes are required. The power setpoint is adjusted to obtain this rate. DCS is preferred because it has a faster deposition rate than $SiH_4$ at this elevated temperature (950° C.). In addition, it produces polysilicon with a thinner grain than with $SiH_4$, increasing thereby its emissivity and in turn the accuracy of the temperature measurement by the optical pyrometer 19.

Finally, the susceptor top is coated with polysilicon using a $SiH_4$ precursor (step 23). The chamber is first cooled down to 675° C., then the top coating is performed with the following operating conditions:

Polysilicon Coating (Susceptor Top)

| | |
|---|---|
| Temp.: | 675° C. |
| $SiH_4$ flow: | 0.5 slm |
| $H_2$ flow: | 9.5 slm |
| Duration: | 400 s |
| Dep. rate: | 150 nm/min |

Note that the top polysilicon coating can be performed using either $SiH_4$ and $PH_3$ to deposit doped polysilicon or $SiH_4$ only to deposit intrinsic polysilicon as described above. The thickness of the top coating is important for subsequent dielectric/polysilicon deposition steps in the processing chamber to ensure a sufficient protection of the carbon susceptor. Since the top coating now is accurately controlled by the temperature, the pyrometer 19 must be correctly set up.

Note that there is an $H_2$ purge performed after each polysilicon coating step such as described below:

$H_2$ purge

| | |
|---|---|
| $H_2$ flow: | 10 slm |
| Lamp power: | 43 kW |
| Duration: | 60 s |

As such, the carbon susceptor is now ready for the deposition of dielectric materials, typically $Si_3N_4$, in the AME Centura tool.

When a great number of wafers have been processed, it is necessary to perform a total cleaning of the reactor walls and the susceptor using $NF_3$ to remove all the $Si_3N_4$ material deposited thereon, then with HCl to remove the polysilicon coating the susceptor that has been damaged using the operating conditions given below:

$NF_3$ clean

| | |
|---|---|
| Pressure: | 500 Torr |
| Temp.: | 850° C. |
| $NF_3$ flow: | 250 sccm |
| $N_2$ flow: | 2 sccm |

$Si_3N_4$ etch rate: 1 $\mu$m/mn
Poly. etch rate: 0.3 $\mu$m/mn

HCl Clean

| | |
|---|---|
| Lamp power: | 43 kW |
| Pressure: | 660 Torr |
| HCl flow: | 9.9 slm |
| $H_2$ flow: | 5 slm |
| Temp.: | 1200° C. |
| Poly. etch rate: | 2 $\mu$m/mn |

As a matter of fact, the processing chamber needs to be cleaned and the susceptor reconditioned after 15 $\mu$m of $Si_3N_4$ material have been deposited, i.e. after about 6000 wafers have been processed. The susceptor is reconditioned as described above by reference to FIG. 3. The chamber will be then ready for running again a great number of dielectric/non-dielectric deposition steps.

Deposition of Dielectric Materials $Si_3N_4$ Deposition

| | |
|---|---|
| Pressure: | 80–150 Torr |
| Temperature: | 600–950° C. |
| $NH_3$ flow: | 3.2 slm |
| $SiH_4$ flow: | 30 sccm |
| $N_2$ flow: | 5 slm |

$SiO_2$ Deposition

| | |
|---|---|
| Pressure: | 50–100 Torr |
| Temperature: | 600–950° C. |
| $SiH_4$ flow: | 60 sccm |
| $N_2O$ flow: | 2.8 slm |
| $N_2$ flow: | 9.2 slm |

Presence of hydrogen atoms is not a problem in the formation of $SiO_2$ spacers, but the above deposition process cannot be used to deposit the $SiO_2$ gate layer, because, in this case the $SiO_2$ material must be totally pure and not contaminated.

The SACVD reactor such as modified according to the present invention can be generalized to the deposition of more complex dielectric materials, such as SiON using the following operating conditions.

SiON Deposition

| | |
|---|---|
| Pressure: | 80–150 Torr |
| Temperature: | 600–950° C. |
| $NH_3$ flow: | 1 slm |
| DCS flow: | 200 sccm |
| $N_2O$ flow: | 2.8 slm |
| $N_2$ flow: | 5 slm |

When placed in the AME Centura reactor, the polysilicon-coated carbon susceptor still allows polysilicon deposition but is adequate to the deposition of other materials such as metal when the cleaning gases that are used are aggressive to carbon.

Deposition of Non-Dielectric Materials

Deposition of Doped Polysilicon

| | |
|---|---|
| Pressure: | 80–160 Torr |
| Temperature: | 600–700° C. |
| $SiH_4$ flow: | 0.3 slm |
| $H_2$ flow: | 9.9 slm |
| $PH_3$ flow: | 0.09 slm |

Deposition of Intrinsic Polysilicon

| | |
|---|---|
| Pressure: | 80–160 Torr |
| Temperature: | 650–750° C. |
| $SiH_4$ flow: | 0.3 slm |
| $H_2$ flow: | 9.9 slm |

Let us consider again the GC stack formation described above in the Background of the Invention section of this patent application. Using the AME Centura tool modified according to the teachings of the present invention, the new sequence of deposition steps becomes:

Doped Polysilicon Deposition

| | |
|---|---|
| Pressure: | 80 Torr |
| Temperature: | 660° C. |
| $SiH_4$ flow: | 0.3 slm |
| $H_2$ flow: | 9.9 slm |
| $PH_3$ flow: | 0.09 slm |
| Dep. rate: | 80 nm/min |
| Cycle time: | 4 mn |

$WSi_x$ Deposition

| | |
|---|---|
| Pressure: | 1 Torr |
| Temperature: | 550° C. |
| $WF_6$ flow: | 2.4 sccm |
| DCS flow: | 175 sccm |
| Ar flow: | 1500 sccm |
| Dep. rate: | 12 nm/min |
| Cycle time: | 5 mn |

$Si_3N_4$ Deposition

| | |
|---|---|
| Pressure: | 100 Torr |
| Temperature: | 785° C. |
| $NH_3$ flow: | 3.2 slm |
| $SiH_4$ flow: | 30 sccm |
| $N_2$ flow: | 5 slm |
| Dep. rate: | 35 nm/mn |
| Cycle time: | 6 min |

The deposition of the doped polysilicon and $Si_3N_4$ materials is performed in a first chamber of the AME Centura reactor while the deposition of the $WSi_x$ material is performed in another chamber, as it is made apparent in the TABLE III below:

TABLE III

| Materials | Deposition process |
|---|---|
| $SiO_2$ | APOX |
| Doped polysilicon | SACVD (Chamber 1) |
| $WSi_x$ | SACVD (Chamber 2) |
| $Si_3N_4$ | SACVD (Chamber 1) |

As a result it is a fully integrated process (cluster mode). The total cycle time to process one wafer is now very short (about 15 min), a major advantage for ASICs. Other advantages include a reduced contamination, less loading/unloading operations, no wait time and elimination of a cleaning step. Finally, the throughput is increased.

Figure 4:
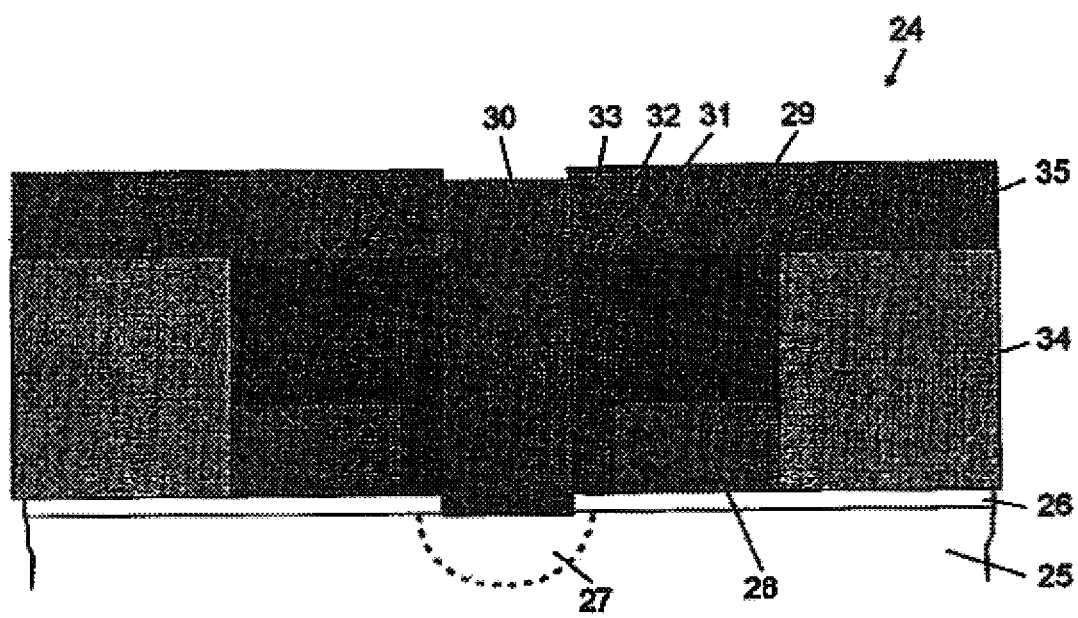
FIG. 4 shows a complex silicon structure represented by the borderless polysilicon contact wherein substantially all the deposition steps can be performed in the AME Centura reactor once modified according to the present invention.

FIG. 4 shows a conventional borderless polysilicon contact structure referenced 24. Now turning to FIG. 4, there is shown a silicon substrate 25 having a thin $SiO_2$ gate layer 26 formed thereon that is provided with an opening to expose a diffusion region 27. The gate conductor stack comprised of a bottom doped polysilicon/$WSi_x$ layer 28 and its top $Si_3N_4$ capping layer 29. It is formed onto the $SiO_2$ gate layer 26 as standard. The borderless doped polysilicon plug 30 contacts the diffusion region 27 and is isolated from the GC stack by a composite insulating layer. Said composite insulating layer comprises sidewall $SiO_2$ spacer 31, $Si_3N_4$ spacer 32 and $Si_3N_4$ barrier 33. The structure 24 further includes BPSG and TEOS planarizing/insulating layers 34 and 35 respectively. With such a structure, the multi-deposition SACVD reactor of the present invention is able to perform the deposition of all the materials mentioned above except the BPSG material, because it contains a P type dopant (boron), it would detrimentally impact the N type doped polysilicon contact plug 30.

The TABLE IV below indicates to a person skilled in the art, the recommended working conditions when two materials of different type (dielectric/non-dielectric) are successively deposited in the same chamber of the AME Centura reactor.

TABLE IV

| 1st material | 2nd material | Conditions |
| --- | --- | --- |
| Polysilicon | $Si_3N_4$ | direct pass |
| Polysilicon | SiON | direct pass |
| $Si_3N_4$ | SiON | direct pass |
| $Si_3N_4$ | Polysilicon | poly coating(1) |
| $Si_3N_4$ | $SiO_2$ | $NF_3$ clean + poly coating(2) |
| SiON | $Si_3N_4$ | direct pass |
| SiON | $SiO_2$ | direct pass |
| $SiO_2$ | $Si_3N_4$ | $NF_3$ clean + poly coating(2) |
| $SiO_2$ | SiON | direct pass |
| SiON | Polysilicon | poly coating(1) |

(1): this step is identical to the step of coating the susceptor top described above but with a lower thickness (0.2 μm). It is required to facilitate polysilicon nucleation on the $Si_3N_4$ material deposited on the susceptor.
(2): after the $NF_3$ cleaning, the polysilicon coating the susceptor top is damaged, so that a new coating has to be done using the same operating conditions as described above (see box 23 in FIG. 3).

The optimum would be to dedicate two chambers of the AME Centura tool (which is a multi-chamber equipment), one to the polysilicon and another to $Si_3N_4$ for successive depositions without unloading the wafer from the tool. In this case, the first chamber would use the original carbon susceptor for polysilicon deposition while the second chamber would be provided with the polysilicon coated carbon susceptor of the present invention. Such an arrangement would allow the fastest cycle time.

With the multi-deposition SACVD reactor of the present invention, above described TABLE II can be re-written as below:

TABLE V

| Module | FEOL/MEOL |
| --- | --- |
| Temp. | 550–950° C. |
| Cycle time | 3–6 min |
| SiN | SACVD |
| SiON | SACVD |
| $SiO_2$ | SACVD |
| Polysilicon | SACVD |

Comparison between TABLES II and V clearly shows the significant improvements brought up by the present invention. New configurations of ICs manufacturing lines can now be envisioned.

Figure 5:
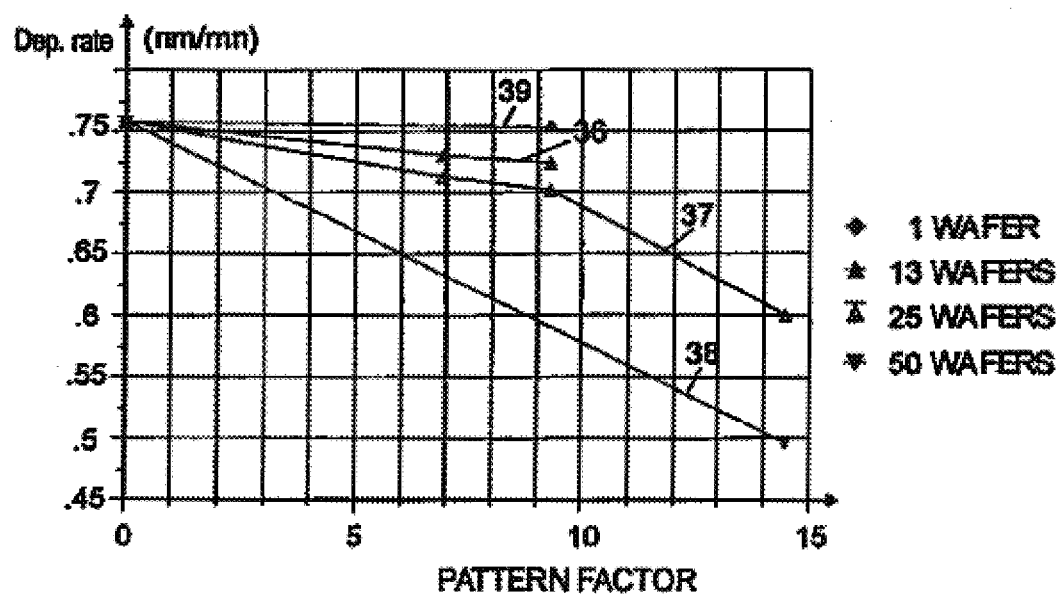
FIG. 5 shows the variations of the deposition rate versus the pattern effect factor to demonstrate the limits of conventional LPCVD techniques in EDRAM chip fabrication in terms of reproducibility.

FIG. 5 shows the variations of the deposition rate (in nm/mn) as a function of the pattern factor. The pattern factor is calculated as the ratio between the etched and un-etched surfaces across a wafer. Experiments have been conducted to deposit $Si_3N_4$ in deep trenches for different capacitor cell densities at 700° C. for LPCVD (curves 36, 37 and 38) and at 785° C. for SACVD (curve 39) for lots of wafers of different capacity (the SACVD deposition rate has been divided by 4 to fit Y-axis scale). A brief comparison between the profiles of curves 36/37/38 and 39 clearly shows that the deposition rate across a LPCVD batch forbids the use of this technique for every step where thickness control is critical. The LPCVD deposition rate varies as a function of the pattern factor even more the number of wafers in the batch is high, while the SACVD deposition rate is constant. As apparent in FIG. 5, the reproducibility of conventional LPCVD techniques in EDRAM/SDRAM chip fabrication is clearly limited. In this case, the SACVD single wafer tool is by far preferred to insure wafer to wafer thickness uniformity control.

Figure 6:
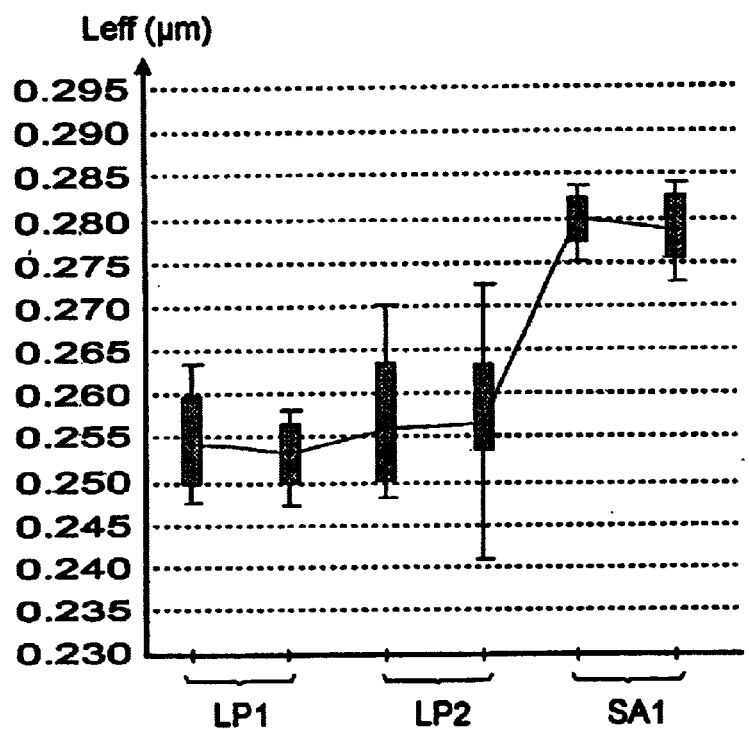
FIG. 6 is a graph showing the variations of the effective channel length $L_{eff}$ for POR LPCVD techniques (at two different temperatures) and the SACVD technique according to the present invention for different lots of wafers.
Figure 7:
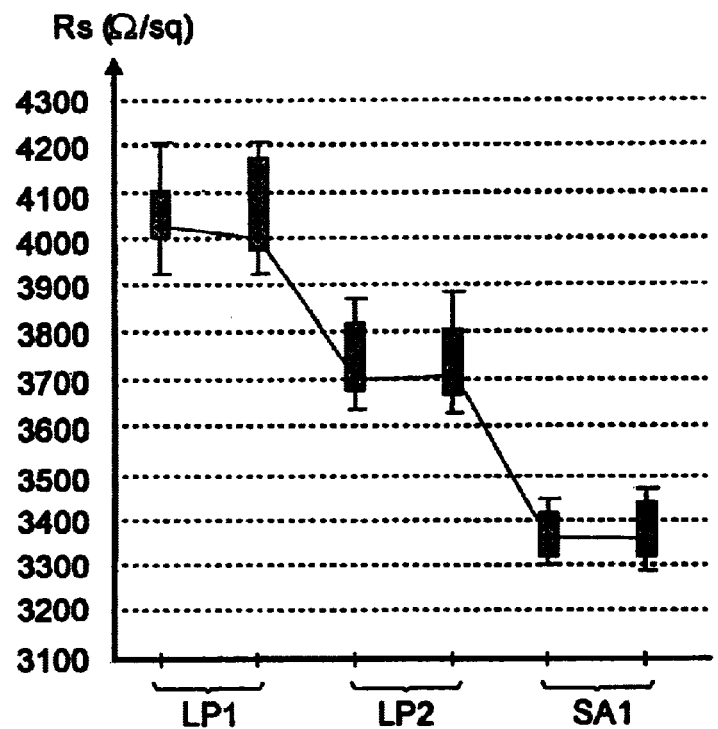
FIG. 7 is a graph showing the variations of the sheet resistance Rs of diffusion regions in the array area for POR LPCVD techniques (at two different temperatures) and the SACVD technique according to the present invention for different lots of wafers.

The deposition temperature is quite critical to the device performance and strongly influences the thermal budget as it will be now made apparent in FIGS. 6 and 7.

FIG. 6 is a graph showing the variations of the effective channel length $L_{eff}$ (in μm) around the desired nominal value $L_{eff}$=0.28 μm for POR LPCVD techniques (at two different temperatures) and the SACVD technique according to the present invention for two lots of wafers each. Wafers were processed at 700° C. for the two lots LP1 and at a temperature of 650 ° C. for the two lots LP2 for approximately the same time (3 H) using the LPCVD technique. Wafers of two lots SA1 were processed at 785° C. during 5 min using the SACVD technique. As apparent in FIG. 6, in the latter case, the $L_{eff}$ variations around the nominal value and within a lot are more limited. As known for those skilled in the art, a reduction of the $L_{eff}$ value has detrimental consequences on the device (IGFET) reliability.

FIG. 7 is a graph showing the variations of the sheet resistance Rs (in Ohm/square) of diffusion regions in the array area around the desired nominal value Rs=3400 Ohm/square for POR LPCVD techniques (at two different temperatures) and the SACVD technique according to the present invention using the same operating conditions as described above by reference to FIG. 6. The sheet resistance of the two lots SA1 processed with the SACVD technique varies much less and is more centered around the nominal value when compared to the sheet resistance of lots LP1 and LP2 processed with the LPCVD technique.

FIGS. 6 and 7 clearly demonstrates that the role of the thermal budget (temperature/time couple) is essential.

The new design of the multi-deposition SACVD reactor described above significantly improves the process window and the thermal budget required for advanced EDRAM/SDRAM silicon chips with reduced scale, i.e. beyond 0.20 μm. Moreover, the cycle time of depositing dielectric materials with such a reactor is significantly shortened, compared to LPCVD furnaces. It has become an important technology parameter to date to quickly adapt a DRAM memory manufacturing line to the fabrication of ASIC products at reduced cost. ASIC market competitiveness depends strongly upon short cycle times, customer satisfaction and the ability to exploit new business opportunities in a very competitive OEM environement.

While the invention has been particularly described with respect a preferred embodiment thereof it should be understood by one skilled in the art that the foregoing and other changes in form and details may be made therein without departing from the spirit and scope of the invention.

What is claimed is:

1. A multideposition sub-atmospheric chemical vapor deposition (SACVD) reactor comprising:
   a substrate processing chamber;
   a carbon susceptor adapted to hold a subtrate in said substrate processing chamber during a SACVD operation, wherein said carbon susceptor is coated by a polysilicon film to protect it against said cleaning gases, wherein said polysilicon coating comprises a bottom polysilicon coating and a top polysilicon coating of different thicknesses, and said bottom polysilicon coating has a thickness of about 4 μm and said top polysilicon coating has a thickness of about 1.5 μm;

a gas distribution system including appropriate valves, gas supply lines and other equipment adapted to flow gases into said substrate processing chamber, wherein said gases include dielectric and non-dielectric forming gases and in-situ cleaning gases that are aggressive to carbon;

a heating system to heat said susceptor to an adequate deposition temperature;

a pressurization system adapted to set a pressure level within said substrate processing chamber; and a controller coupled to said gas distribution system and pressurization system for directing operation of said SACVD reactor.

2. The SACVD reactor of claim 1 wherein said dielectric material is $Si_3N_4$ and said forming gas is a $SiH_4/NH_3$ mixture.

3. The SACVD reactor of claim 1 wherein said dielectric material is $SiO_2$ and said forming gas is a $SiH_4/NO_2$ mixture.

4. The SACVD reactor of claim 1 wherein said dielectric material is SiON and said forming gas is either a $DCS/N_2O/NH_3$ mixture or a $SiH_4/N_2O/NH_3$ mixture.

5. The SACVD reactor of claim 1 wherein said non-dielectric material is doped polysilicon and said forming gas is a $SiH_4/PH_3$ mixture.

6. The SACVD reactor of claim 2 wherein said cleaning gases are selected from the group consisting of $NF_3$ and HCl.

7. The SACVD reactor of claim 1 wherein said dielectric material is $Si_3N_4$ and said deposition is performed in a Centura HTF reactor at a pressure of about 80 Torr to about 150 Torr, at a temperature of about 650° C. to about 800° C., with a $NH_3$ flow of about 3.2 slm, with a $SiH_4$ flow of about 30 sccm, with a $N_2$ flow of about 5 slm, and for a duration of about 5 min.

8. The SACVD reactor of claim 1 wherein said dielectric material is $SiO_2$ and said deposition is performed in a Centura HTF reactor at a pressure of about 50 Torr to about 100 Torr, at a temperature of about 600° C. to about 900° C., with a $SiH_4$ flow of about 60 sccm, with a $N_2O$ flow of about 2.8 slm, and with a $N_2$ flow of about 9.2 slm.

9. The SACVD reactor of claim 1 wherein said dielectric material is SiON and said deposition is performed in a Centura HTF reactor at a pressure of about 80 Torr to about 150 Torr, at a temperature of about 650° C. to about 800° C., with a $NH_3$ flow of about 1 slm, with a DCS flow of about 200 sccm, with a $N_2O$ flow of about 2.8 slm, and with a $N_2$ flow of about 5 slm.

10. A susceptor for dielectric and non-dielectric material deposition in a SACVD reactor resistant to $NF_3$ attack comprising a carbon plate coated by a polysilicon film, wherein said polysilicon coating comprises a bottom polysilicon coating and a top polysilicon coating of different thicknesses, and said bottom polysilicon coating has a thickness of about 4 μm and said top polysilicon coating has a thickness of about 1.5 μm.

11. The SACVD reactor of claim 1, wherein said substrate processing chamber has upper and low volumes separated by said carbon susceptor, and said gas distribution system includes first and second gas injection means for respectively injecting gases in the upper and lower volumes of the processing chamber.

* * * * *